(12) United States Patent
Maemura et al.

(10) Patent No.: US 7,285,817 B2
(45) Date of Patent: Oct. 23, 2007

(54) SEMICONDUCTOR DEVICE

(75) Inventors: Kimihiro Maemura, Suwa (JP);
Hitoshi Kobayashi, Suwa (JP);
Tadatoshi Nakajima, Suwa (JP);
Satoru Kodaira, Chino (JP)

(73) Assignee: Seiko Epson Corporation (JP)

( * ) Notice: Subject to any disclaimer, the term of this patent is extended or adjusted under 35 U.S.C. 154(b) by 41 days.

(21) Appl. No.: 11/223,679

(22) Filed: Sep. 9, 2005

(65) Prior Publication Data
US 2006/0055044 A1 Mar. 16, 2006

(30) Foreign Application Priority Data
Sep. 10, 2004 (JP) ............... 2004-263249

(51) Int. Cl.
*H01L 29/788* (2006.01)
(52) U.S. Cl. ............................... 257/315; 257/E29.17
(58) Field of Classification Search ........... 257/323, 257/324, 435, 431, 433, 444, 508, 684, 758, 257/659, 660, 315, E29.17
See application file for complete search history.

(56) References Cited

U.S. PATENT DOCUMENTS

| 5,440,510 | A | 8/1995 | Caprara et al. |
| 5,986,284 | A | 11/1999 | Kusaba et al. |
| 7,160,795 | B2 * | 1/2007 | Batra et al. ............ 438/612 |
| 2003/0173675 | A1 * | 9/2003 | Watanabe et al. ....... 257/758 |

FOREIGN PATENT DOCUMENTS

| JP | 57-030345 | 2/1982 |
| JP | 58-222546 | 12/1983 |
| JP | 1-87545 | 6/1989 |
| JP | 6-163917 | 6/1994 |
| JP | 06-169102 | 6/1994 |
| JP | 10-163209 | 6/1998 |
| JP | 10-294444 | 11/1998 |
| JP | 11-288934 | 10/1999 |
| JP | 2001-174850 | 6/2001 |
| JP | 2002-009074 | 1/2002 |
| JP | 2003-124363 | 4/2003 |
| JP | 2003-234467 | 8/2003 |

OTHER PUBLICATIONS

Communication from Japanese Patent Office re: related application.
Communication from Korean Patent Office regarding counterpart application.

* cited by examiner

*Primary Examiner*—Asok K. Sarkar
*Assistant Examiner*—Jenny L Wagner
(74) *Attorney, Agent, or Firm*—Harness, Dickey & Pierce, P.L.C.

(57) ABSTRACT

A semiconductor device includes: a semiconductor layer having a shading target region; a semiconductor element provided on the semiconductor layer in the shading target region; a first interlayer dielectric provided on the semiconductor element; a plurality of first shading layers provided on the first interlayer dielectric; a second interlayer dielectric provided on at least the first shading layers; and a second shading layer provided on the second interlayer dielectric and having a predetermined pattern. The second shading layer has such a pattern that the second shading layer is positioned at least between the adjacent first shading layers.

27 Claims, 9 Drawing Sheets

SEMICONDUCTOR DEVICE

Japanese Patent Application No. 2004-263249, filed on Sep. 10, 2004, is hereby incorporated by reference in its entirety.

BACKGROUND OF THE INVENTION

The present invention relates to a semiconductor device including a semiconductor element which may change in characteristics upon exposure to light.

As examples of a semiconductor element which may change in characteristics upon exposure to light, a MOS transistor, a nonvolatile memory including a floating gate electrode, and the like can be given. These semiconductor elements are exposed to light especially when mounted using a COG mounting method such as bare chip mounting. As a result, on/off characteristics may be changed in the case of a MOS transistor, or electrons injected into the floating gate electrode may be removed in the case of a nonvolatile memory. In order to prevent such a change in characteristics of the semiconductor element, a shading layer for preventing application of light is provided above the region in which these devices are provided.

A technology using the shading layer is disclosed in Japanese Patent Application Laid-Open No. 11-288934. In Japanese Patent Application Laid-Open No. 11-288934, two shading layers which cover the semiconductor elements are provided at different levels, and these shading layers are connected through a contact layer.

However, since it is impossible to sufficiently shade light merely by providing the shading layers above the shading target region, it is necessary to form the shading layers so as to widely cover the surroundings of the shading target region in order to increase the shading effect. Therefore, the area of the shading layer cannot be reduced, and a reduction in size of the semiconductor device may be hindered. In the case where the area of the shading target region is large, the shading target region may not be covered with a single shading layer due to design rule limitations.

SUMMARY

A first aspect of the invention relates to a semiconductor device, comprising:

a semiconductor layer having a shading target region;

a semiconductor element provided on the semiconductor layer in the shading target region;

a first interlayer dielectric provided on the semiconductor element;

a plurality of first shading layers provided on the first interlayer dielectric;

a second interlayer dielectric provided on at least the first shading layers; and a second shading layer provided on the second interlayer dielectric, wherein the second shading layer has such a pattern that the second shading layer is provided at least between the adjacent first shading layers.

A second aspect of the invention relate to a semiconductor device, comprising:

a semiconductor layer having a shading target region;

a semiconductor element provided on the semiconductor layer in the shading target region;

a first interlayer dielectric provided on the semiconductor element;

a first shading layer provided on the first interlayer dielectric, wherein the first shading layer has maximum dimensions according to a design rule in the shading target region.

DETAILED DESCRIPTION OF THE EMBODIMENT

Figure 1A:
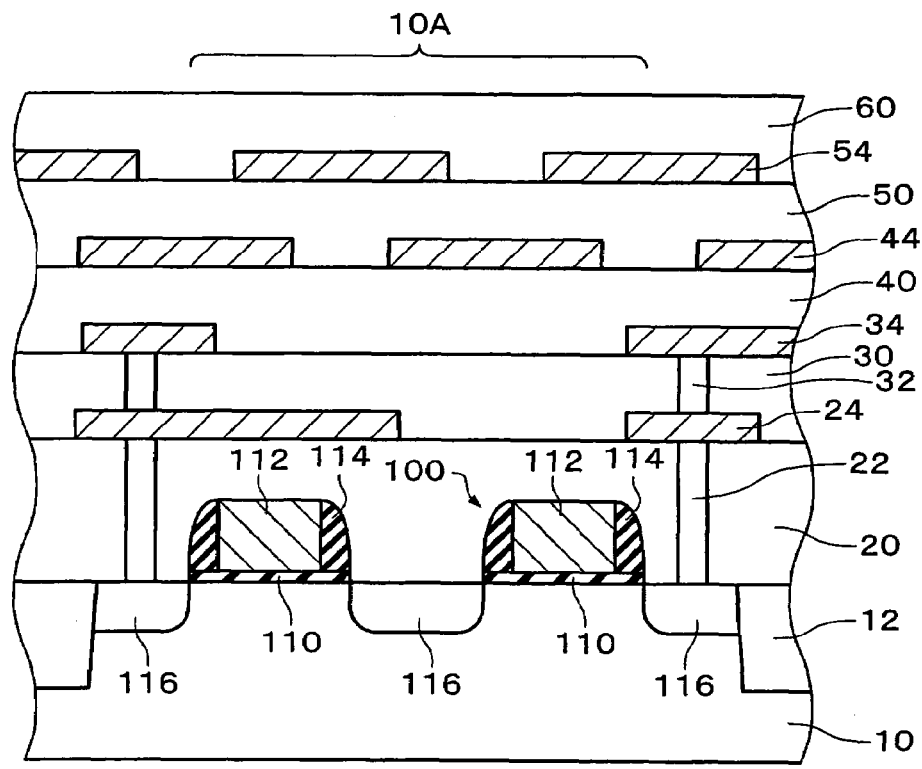
FIG. 1A is a cross-sectional view schematically showing a semiconductor device according to a first embodiment.

The invention may provide a semiconductor device which has improved reliability due to high shading effect and can be reduced in size.

A semiconductor device according to one embodiment of the invention includes:

a semiconductor layer having a shading target region;

a semiconductor element provided on the semiconductor layer in the shading target region;

a first interlayer dielectric provided on the semiconductor element;

a plurality of first shading layers provided on the first interlayer dielectric;

a second interlayer dielectric provided on at least the first shading layers; and a second shading layer provided on the second interlayer dielectric, wherein the second shading layer has such a pattern that the second shading layer is provided at least between the adjacent first shading layers.

According to the semiconductor device in the embodiment, the semiconductor element is covered with the first shading layer provided above the semiconductor element and the second shading layer provided at a level differing from the first shading layer. Therefore, a highly reliable semiconductor device in which the semiconductor element is not exposed to light and does not show variation in characteristics can be provided. In particular, when the shading target region is large, the shading target region may not be covered with a single metal layer. However, according to the semiconductor device in the embodiment, the shading target region can be covered, even if the area of the shading target region is large, by alternately disposing the metal layers at different levels, whereby a semiconductor device with improved reliability can be provided.

The semiconductor device in the embodiment may have the following features.

With this semiconductor device, the shading target region may be covered with at least one of the first shading layer and the second shading layer.

According to this feature, since the shading target region is covered with at least one of the first shading layer and the second shading layer, the semiconductor element of which the characteristics may be changed upon exposure to light can be prevented from being exposed to light.

With this semiconductor device, the second shading layer may have a pattern including at least an inverted shape of the first shading layer.

According to this feature, since the shading target region is covered with at least one of the first shading layer and the second shading layer, the semiconductor element can be prevented from being exposed to light.

With this semiconductor device, at least one of the first shading layer and the second shading layer may have maximum dimensions according to a design rule in the shading target region.

The statement "has maximum dimensions" includes the case where the first shading layer locally has maximum dimensions in addition to the case where the entire first shading layer has maximum dimensions.

With this semiconductor device, the second shading layer may be provided to partially overlap the first shading layer.

According to this feature, since the first shading layer and the second shading layer partially overlap in the shading target region, the shading effect can be further improved.

With this semiconductor device, the first shading layer may be an interconnect layer.

With this semiconductor device, the second shading layer may be an interconnect layer.

This semiconductor device may further include a via layer which connects the first shading layer and the second shading layer.

According to this feature, since the via layer which connects the first shading layer and the second shading layer can prevent incidence of light in the lateral direction, the shading effect can be further improved. As a result, a highly reliable semiconductor device can be provided.

With this semiconductor device, the via layer may be provided in an overlapping area of the first shading layer and the second shading layer.

This semiconductor device may further include:
a third interlayer dielectric provided between the semiconductor element and the first interlayer dielectric; and
an interconnect layer provided on the third interlayer dielectric, and
the interconnect layer may have maximum dimensions according to a design rule in the shading target region.

A semiconductor device according to another embodiment of the invention includes:
a semiconductor layer having a shading target region;
a semiconductor element provided on the semiconductor layer in the shading target region;
a first interlayer dielectric provided on the semiconductor element;
a first shading layer provided on the first interlayer dielectric,
wherein the first shading layer has maximum dimensions according to a design rule in the shading target region.

This semiconductor device may include a shading region provided outside the shading target region, and
the shading region may include:
the first interlayer dielectric provided on the semiconductor layer;
a first metal layer provided on the first interlayer dielectric;
at least one contact layer provided between the semiconductor layer and the first metal layer;
the second interlayer dielectric provided on at least the first metal layer;
a second metal layer provided on the second interlayer dielectric; and
at least one via layer which connects the first metal layer and the second metal layer.

According to this semiconductor device, since the via layer and the contact layer are provided in the shading region outside the shading target region, the effect of preventing incidence of light in the lateral direction can be improved.

With this semiconductor device the shading region may be provided to enclose the shading target region.

With this semiconductor device the via layer may be formed by filling a ring-shaped groove with a conductive layer in the shading region.

With this semiconductor device the contact layer may be formed by filling a ring-shaped groove with a conductive layer in the shading region.

According to this feature, since the side of the shading target region is covered with the contact layer and the via layer, the shading effect can be further improved.

With this semiconductor device the via layers may be provided in the shading region in a staggered arrangement.

The semiconductor device the contact layers may be provided in the shading region in a staggered arrangement.

According to this feature, since the side of the shading target region is covered with at least one of the contact layer and the via layer, the shading effect can be further improved.

With this semiconductor device, the semiconductor element may be a single-layer gate type nonvolatile memory.

According to this feature, a semiconductor device including a nonvolatile memory with improved charge retention characteristics can be provided.

Embodiments of the present invention are described below.

1. First Embodiment

Figure 1B:
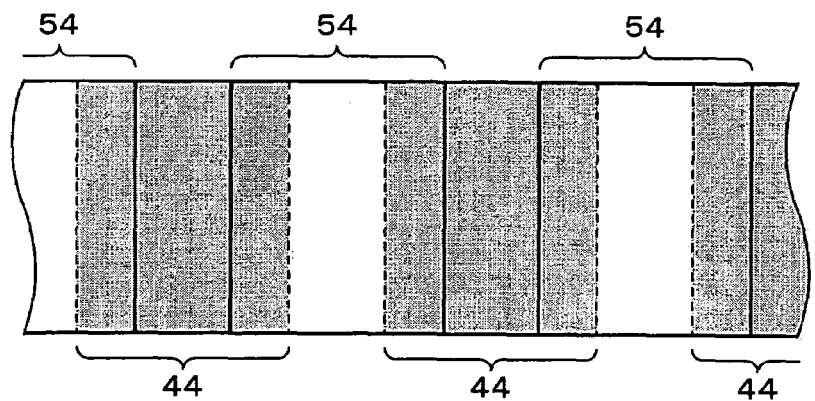
FIG. 1B is a plan view of the semiconductor device.

A semiconductor device according to a first embodiment is described below with reference to FIGS. 1A and 1B. FIG. 1A is a cross-sectional view schematically showing a semiconductor device in this embodiment, and FIG. 1B is a plan view showing a shading target region 10A of the semiconductor device shown in FIG. 1A.

As shown in FIG. 1, the semiconductor device in this embodiment includes the shading target region 10A in which semiconductor elements such as a MOS transistor 100 are formed. The elements making up the MOS transistor are not necessarily entirely included in the shading target region 10A. It suffices that at least a section (e.g. gate electrode) which makes up the MOS transistor 100 and affects the characteristics of the MOS transistor 100 upon exposure to light be included in the shading target region 10A.

The MOS transistor 100 includes a gate insulating layer 110 provided on a semiconductor layer 10, a gate electrode 112 provided on the gate insulating layer 110, a sidewall insulating layer 114 provided on the side surface of the gate electrode 112, and an impurity region 116 provided in the semiconductor layer 10. The impurity region 116 functions as a source region or a drain region of the MOS transistor 100.

The MOS transistor 100 is covered with the interlayer dielectric 20, and interlayer dielectrics 30, 40, 50, and 60 are provided on the interlayer dielectric 20 in that order. As the interlayer dielectrics 20, 30, 40, 50, and 60, a known insulating film such as an oxide film or a nitride film may be used. A plurality of shading layers 44 are provided between the interlayer dielectric 40 and the interlayer dielectric 50, and a plurality of shading layers 54 are provided between the interlayer dielectric 50 and the interlayer dielectric 60. The shading layer 44 and the shading layer 54 are respectively provided on the interlayer dielectrics 40 and 50 at different levels. The shading layer 54 is provided to be positioned at least between the shading layers 44. In the semiconductor device in this embodiment, the shading layer 54 has such a pattern that the shading layer 54 is positioned between the shading layers 44 and the shading layer 44 and the shading layer 54 partially overlap. Specifically, the shading layer 54 has a pattern including at least the inverted shape of the shading layer 44.

As shown in FIG. 1B, in the semiconductor device in this embodiment, the shading target region 10A is covered with at least one of the shading layer 44 and the shading layer 54.

According to the semiconductor device in this embodiment, the entire shading target region 10A is complementarily covered with the first shading layers 44 provided above the MOS transistor 100 as the semiconductor element and the second shading layers 54 provided at a level differing from the first shading layers 44. Therefore, a highly reliable semiconductor device in which the semiconductor element is not exposed to light and does not show variation in characteristics can be provided. In particular, when the shading target region is large, the shading target region may not be covered with a single metal layer. However, according to the semiconductor device in this embodiment, the entire shading target region 10A can be covered, even if the shading target region 10A is large, by alternately disposing the shading layers 44 and 54 at different levels in a plan view, whereby a highly reliable semiconductor device can be provided.

2. Second Embodiment

Figure 2A:
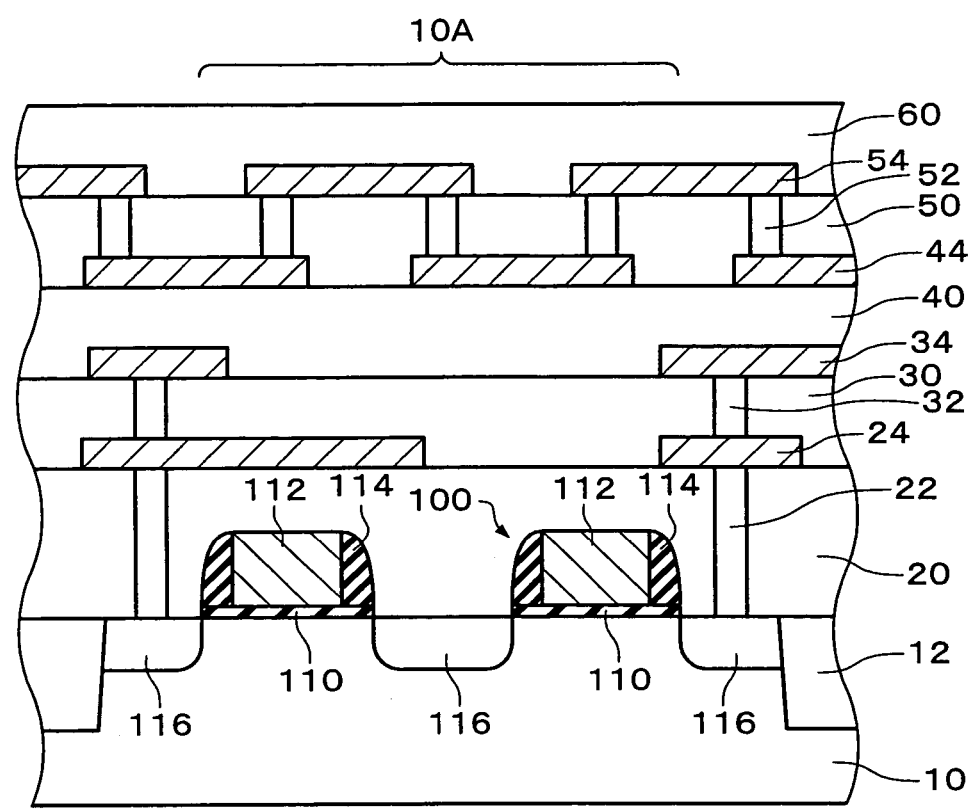
FIG. 2A is a cross-sectional view schematically showing a semiconductor device according to a second embodiment.
Figure 2B:
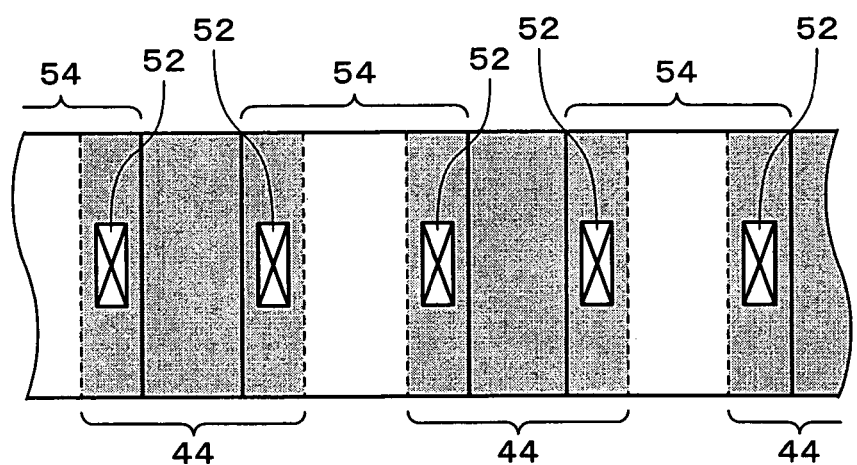
FIG. 2B is a plan view of the semiconductor device.

A semiconductor device according to a second embodiment is described below. The second embodiment illustrates an example in which a via layer which connects the shading layer 44 and the shading layer 54 is provided in the semiconductor device in the first embodiment. FIG. 2A is a cross-sectional view schematically showing the semiconductor device according to this embodiment, and FIG. 2B is a plan view of the semiconductor device shown in FIG. 2A. In the following description, detailed description of features the same as the features in the first embodiment may be omitted.

As shown in FIG. 2A, the semiconductor device in this embodiment includes the shading target region 10A in which the MOS transistor is formed. The MOS transistor 100 is the same as that in the first embodiment. The interlayer dielectrics 20, 30, 40, 50, and 60 are provided on the MOS transistor 100 in that order. A plurality of shading layers 44 are provided on the interlayer dielectric 40, and a plurality of shading layers 54 are provided on the interlayer dielectric 50. The positional relationship between the shading layers 44 and the shading layers 54 is the same as that in the first embodiment.

The shading layer 44 and the shading layer 54 are connected through a via layer 52 provided in the interlayer dielectric 50. The via layer 52 is provided at a position at which the shading layer 44 overlaps the shading layer 54. The via layer 52 is formed by forming a via hole in the interlayer dielectric 50 and filling the via hole with a conductive layer. In the semiconductor device in this embodiment, the via layer 52 is provided at each position at which the shading layer 44 overlaps the shading layer 54, as shown in FIGS. 2A and 2B.

According to the semiconductor device in this embodiment, since the via layer 52 is provided between the shading layer 44 and the shading layer 54, incidence of light in the vertical direction and incidence of light in the lateral direction can be prevented. As a result, the shading effect can be further improved, whereby a semiconductor device exhibiting improved reliability can be provided.

3. Third Embodiment

Figure 3A:
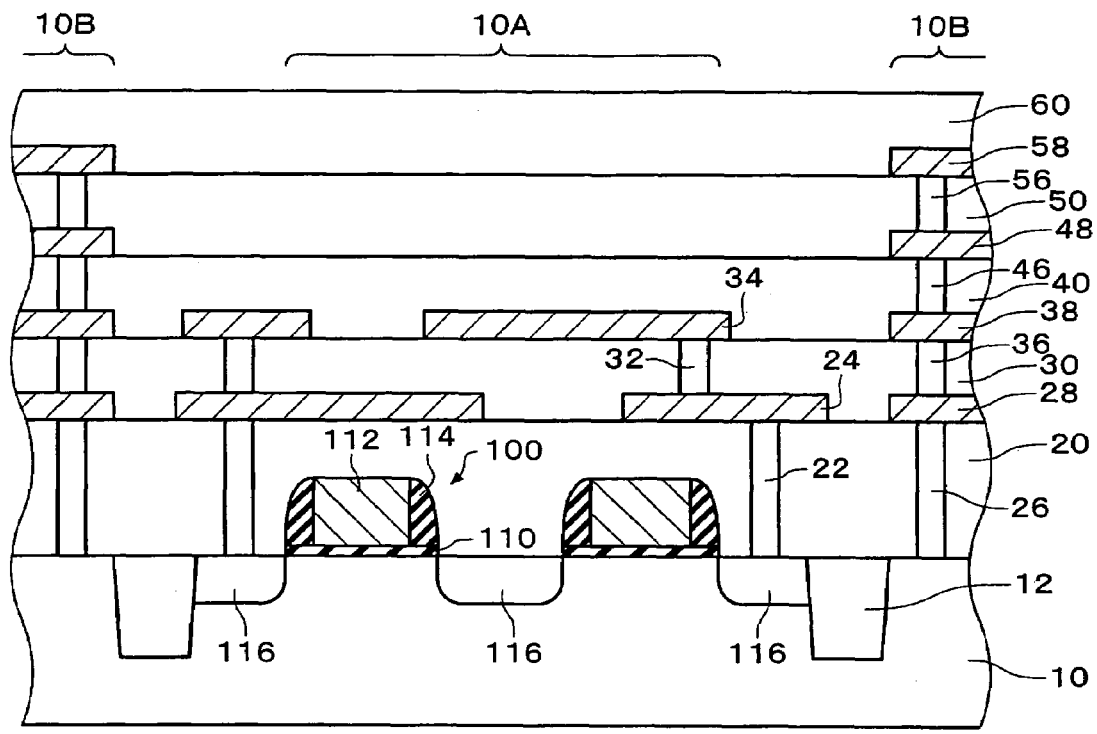
FIG. 3A is a cross-sectional view schematically showing a semiconductor device according to a third embodiment.

A semiconductor device according to a third embodiment is described below. FIG. 3A is a cross-sectional view schematically showing the semiconductor device according to this embodiment. FIG. 3A is a cross-sectional view along the line I-I shown in FIG. 3B. In the following description, detailed description of features the same as the features in the first embodiment may be omitted.

Figure 3B:
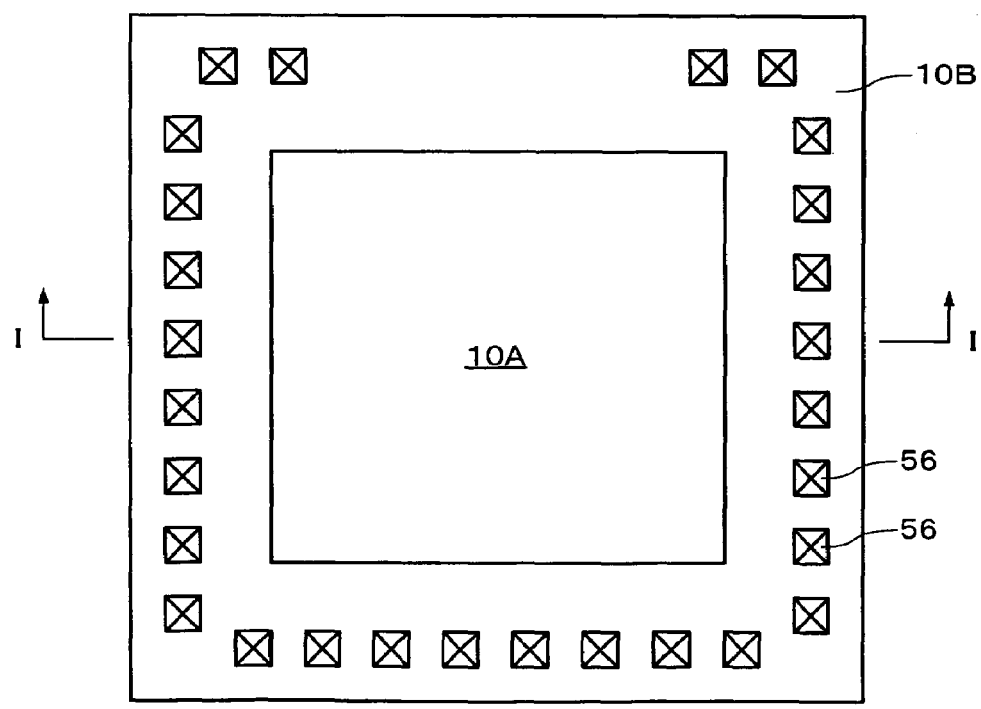
FIG. 3B is a plan view of the semiconductor device.

As shown in FIGS. 3A and 3B, the semiconductor device in this embodiment includes the shading target region 10A in which the semiconductor elements such as the MOS transistor 100 are formed, and a shading region 10B provided outside the shading target region 10A.

In the shading target region 10A, the MOS transistor 100 is formed on the semiconductor layer 10. The MOS transistor 100 is the same as that in the first embodiment. The interlayer dielectric 20 is provided on the MOS transistor 100. An interconnect layer 24 is provided on the interlayer dielectric 20. A contact layer 22 is provided in the interlayer dielectric 20. The contact layer 22 electrically connects the interconnect layer 24 with the impurity region 116 of the MOS transistor 100. The interconnect layer 24 is patterned in the shading target region 10A so as to have a large area within the allowable range according to the design rule in order to provide the function as the shading layer. The interlayer dielectric 30 is provided to cover the interconnect layer 24, and an interconnect layer 34 is provided on the interlayer dielectric 30. The interconnect layer 34 is patterned so as to have the function as the shading layer in the same manner as the interconnect layer 24, and has such a pattern that the interconnect layer 34 covers the shading target region 10A at least in the area in which the shading target region 10A is not covered with the interconnect layer 24.

In the shading region 10B, the interlayer dielectrics 20, 30, 40, 50, and 60 are provided on the semiconductor layer 10 in that order. Metal layers 28, 38, 48, and 58 having a predetermined pattern are respectively provided on the interlayer dielectrics 20, 30, 40, and 50. Each of the metal layers 28, 38, 48, and 58 is formed in the same step as the interconnect layer or the shading layer provided on the same interlayer dielectric in the shading target region 10A.

In the shading region 10B, the semiconductor layer 10 and the metal layer 28 are connected through a contact layer 26. The metal layers 28 and 38, the metal layers 38 and 48, and the metal layers 48 and 58 are respectively connected through via layers 36, 46, and 56.

The semiconductor device in this embodiment is described above taking an example in which the contact layer 26 and the via layers 36, 46, and 56 are formed in the shading region 10B in a row, as shown in FIG. 3B. However, the invention is not limited thereto. The contact layer 26 and the via layers 36, 46, and 56 may be disposed in a plurality of rows in a staggered arrangement.

According to the semiconductor device in this embodiment, since the shading target region 10A is covered with the interconnect layers 24 and 34, incidence of light in the vertical direction can be prevented. Moreover, since the shading target region 10A is enclosed by the via layers 36, 46, and 56 and the contact layer 26 provided in the shading region 10B, incidence of light in the lateral direction can be prevented. As a result, a change in characteristics of the semiconductor element due to application of light can be prevented, whereby a semiconductor device exhibiting improved reliability can be provided.

4. Fourth Embodiment

Figure 4:
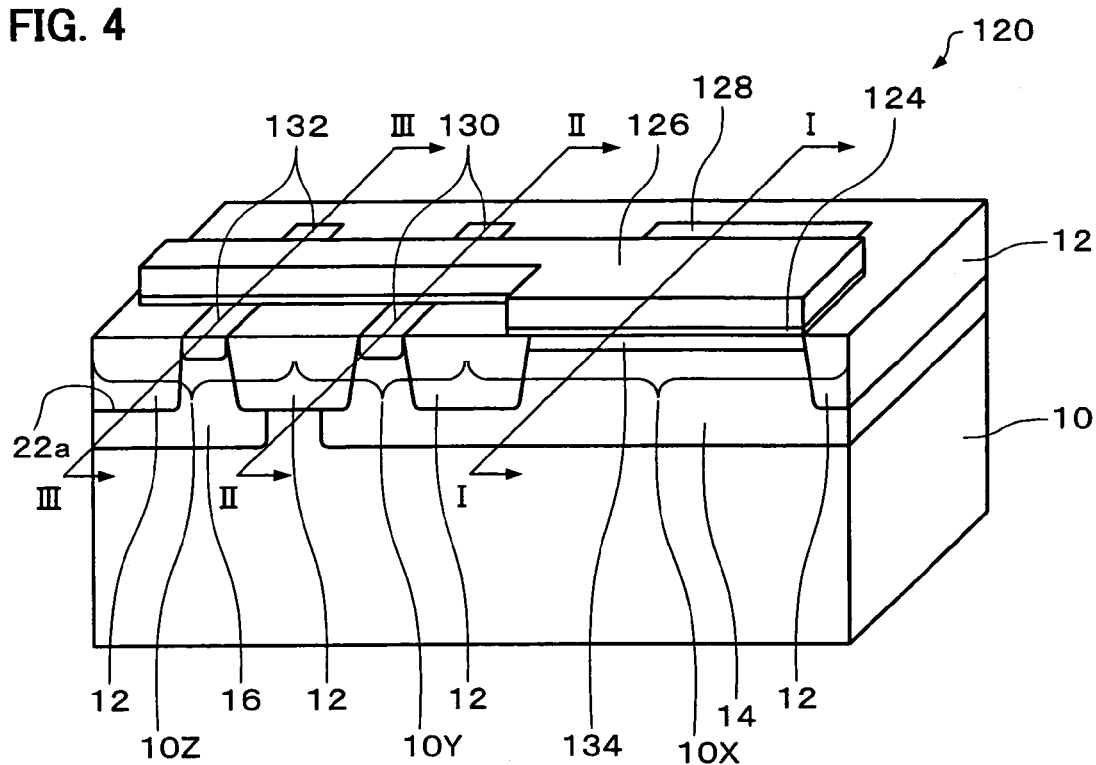
FIG. 4 is a perspective view schematically showing a memory cell provided in a shading target region of a semiconductor device according to a fourth embodiment.

A fourth embodiment is described below with reference to FIGS. 4 to 9. The fourth embodiment illustrates the case where a cell array of nonvolatile memory cells (hereinafter called "memory cells") is formed in the shading target region 10A. FIGS. 4 and 5 show a memory cell as a semiconductor element provided in the shading target region 10A in the semiconductor device in this embodiment. In the following description, a memory cell 120 provided in the shading target region 10A and a shading structure are described in that order.

Figure 5A:
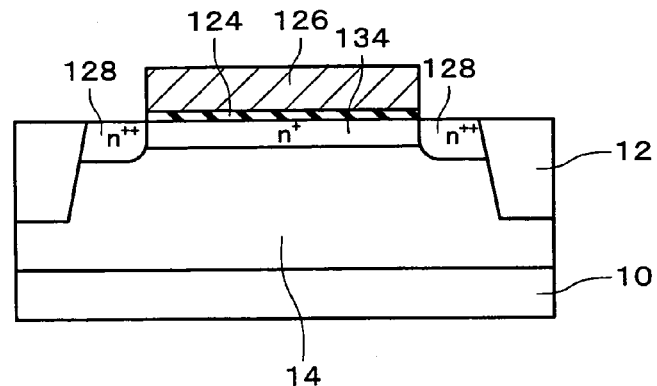
FIGS. 5A to 5C are cross-sectional views schematically showing a memory cell provided in a shading target region of a semiconductor device according to a fourth embodiment.
Figure 5B:
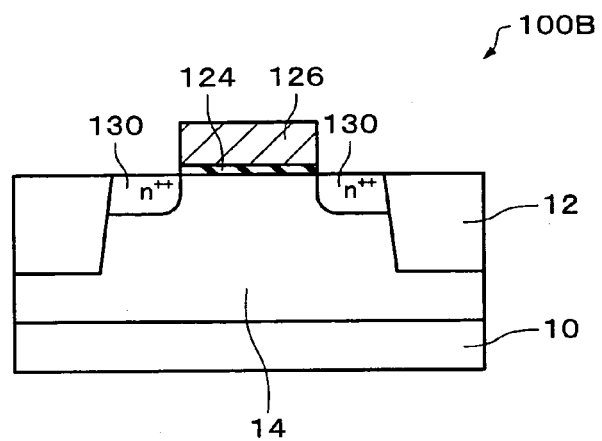
Figure 5C:
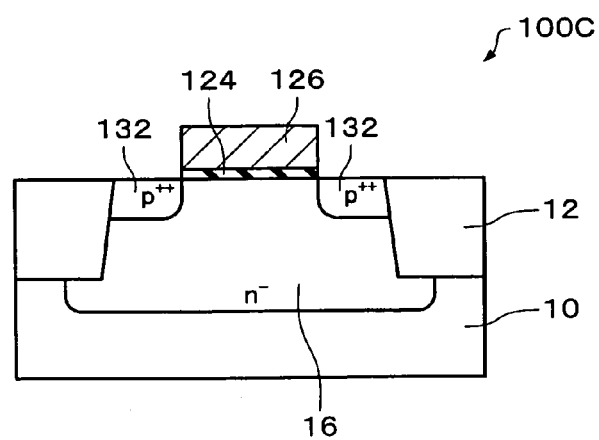

In the memory cell 120 included in the semiconductor device in this embodiment, a control gate is formed of an N-type impurity region in the semiconductor layer 10, and a floating gate electrode is formed of a conductive layer such as a single polysilicon layer (hereinafter may be called "single-layer gate type nonvolatile memory device"). FIG. 4 is a perspective view showing the memory cell, FIG. 5A is a cross-sectional view along the line I-I shown in FIG. 4, FIG. 5B is a cross-sectional view along the line II-II shown in FIG. 4, and FIG. 5C is a cross-sectional view along the line III-III shown in FIG. 4.

As shown in FIG. 4, the memory cell 120 in this embodiment is provided on the P-type semiconductor layer 10. The semiconductor layer 10 is divided into a first region 10X, a second region 10Y, and a third region 10Z by element isolation insulating layers 12. The first region 10X and the second region 10Y are provided in a P-type well 14. The third region 10Z is provided in an N-type well 16. The first region 10X is a control gate section, the second region 10Y is a write section, and the third region 10Z is an erase section.

An insulating layer 124 is provided on the semiconductor layer 10 in the first to third regions 10X to 10Z. A floating gate electrode 126 is provided on the insulating layer 124 across the first to third regions 10X to 10Z.

The cross-sectional structure of each region is described below. As shown in FIG. 5A, the first region 10X includes the insulating layer 124 provided on the well 14, the floating gate electrode 126 provided on the insulating layer 124, an N-type impurity region 134 provided in the semiconductor 10 under the floating gate electrode 126, and N-type impurity regions 128 provided adjacent to the impurity region 134. The N-type impurity region 134 functions as the control gate, and the impurity region 128 functions as a contact section which is electrically connected with a control gate line and applies a voltage to the control gate.

As shown in FIG. 5B, an N-channel MOS transistor 100B for writing data into the memory cell 120 is provided in the second region 10Y. The N-channel transistor 100B includes the insulating layer 124 provided on the well 14, the floating gate electrode 126 provided on the insulating layer 124, and impurity regions 130 provided in the semiconductor layer 10. The impurity region 130 functions as a source region or a drain region.

As shown in FIG. 5C, a P-channel transistor 100C is provided in the third region 10Z. The P-channel transistor 100C includes the insulating layer 124 provided on the N-type well 16, the floating gate electrode 126 provided on the insulating layer 124, and impurity regions 132 provided in the N-type well 16. The impurity region 132 functions as a source region or a drain region.

Figure 6:
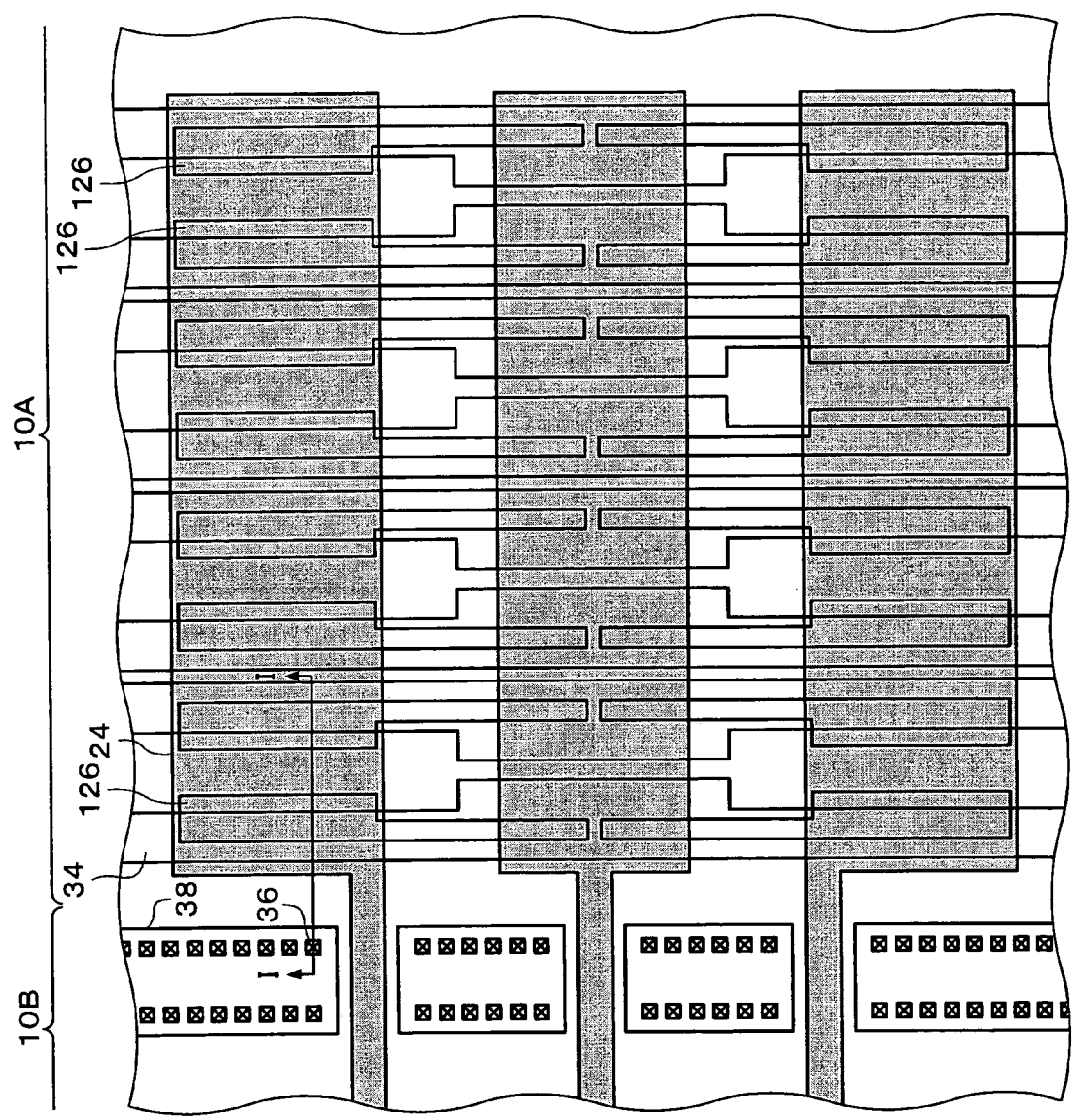
FIG. 6 is a plan view schematically showing the semiconductor device according to the fourth embodiment.
Figure 7:
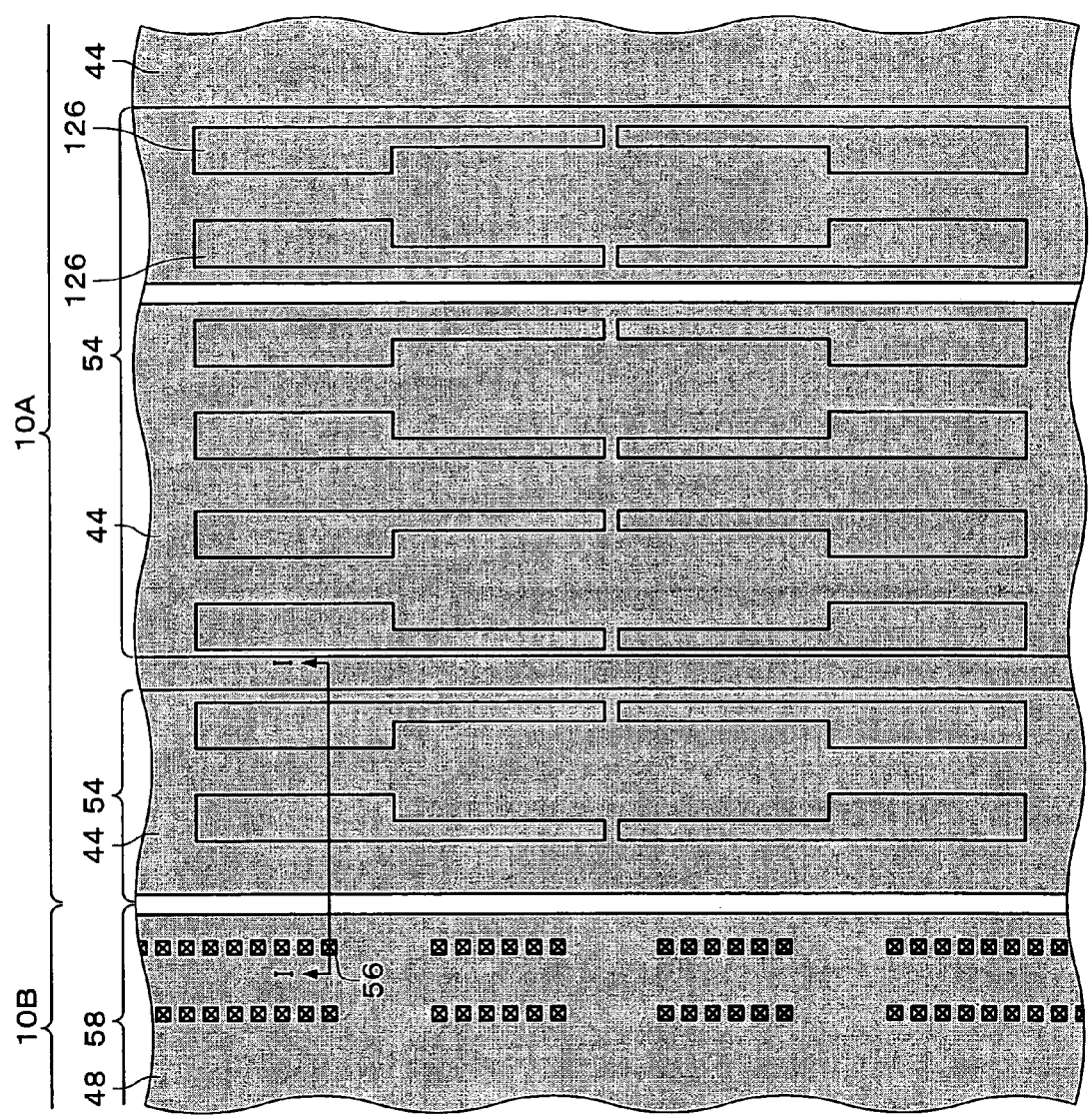
FIG. 7 is a plan view schematically showing the semiconductor device according to the fourth embodiment.

A memory cell array is formed by arranging the memory cells 120. FIGS. 6 and 7 are plan views showing a part of the memory cell array. FIGS. 6 and 7 show only the shape of the floating gate electrode 126 among the constituent elements of the memory cell. A shaded area shows a lower layer in these figures.

In the semiconductor device in this embodiment, four metal layers are provided in the shading target region 10A, and the four metal layers function to shade light. The following description is given in the order from the lowermost metal layer.

The first and second metal layers are described below. As shown in FIG. 6, a plurality of memory cells 120 are disposed in the shading target region 10A in a mirror-image arrangement. The first metal layer is the interconnect layer 24. In the shading target region 10A, the interconnect layer 24 has a pattern with maximum dimensions according to the design rule. The second metal layer is the interconnect layer 34. The second metal layer has such a pattern that the second metal layer covers the floating gate electrode 126 at least in the area in which the floating gate electrode 126 is not covered with the interconnect layer 24. The second metal layer may have maximum dimensions according to the design rule in the same manner as the interconnect layer 24. According to this configuration, the floating gate electrode 126 is covered with at least one of the interconnect layer 24 and the interconnect layer 34 in the shading target region 10A.

The third and fourth metal layers are described below with reference to FIG. 7. In FIG. 7, the interconnect layers 24 and 34 are omitted. The third metal layer is the interconnect layer 44 and has a predetermined pattern in the shading target region 10A. The interconnect layers 44 are provided at predetermined intervals. The interconnect layer 54 as the fourth metal layer is provided above the interconnect layer 44. The interconnect layer 54 is provided at least between the adjacent interconnect layers 44. In this embodiment, the interconnect layer 54 has such a pattern that the interconnect layer 54 is provided between the adjacent interconnect layers 44 and overlaps the interconnect layers 44.

Figure 8:
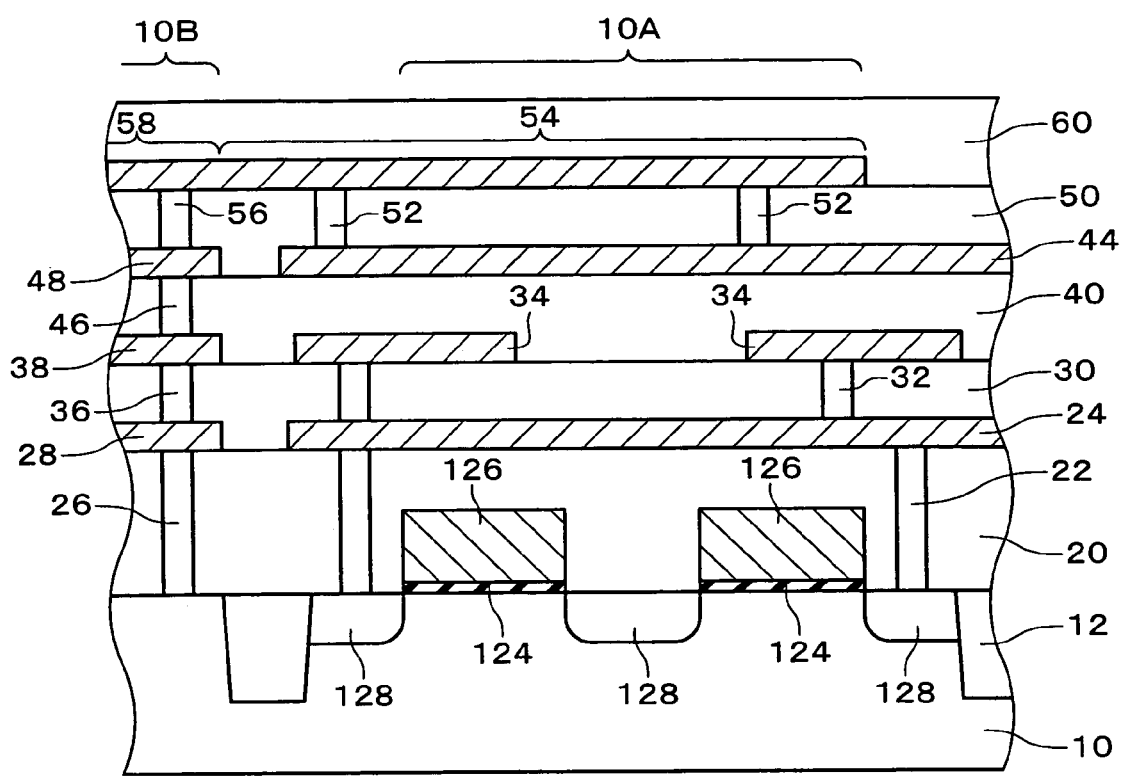
FIG. 8 is a cross-sectional view schematically showing the semiconductor device according to the fourth embodiment.

The positional relationship among the interconnect layers 24, 34, 44, and 54 is described below with reference to a cross-sectional view shown in FIG. 8. FIG. 8 is a cross-sectional view along the line I-I shown in FIGS. 6 and 7. As shown in FIG. 8, the memory cell 120 is provided in the region partitioned by the element isolation insulating layers 12. The interlayer dielectrics 20, 30, 40, 50, and 60 are provided on the nonvolatile memory 120 in that order. The interconnect layers 24, 34, 44, and 54 are respectively provided on the interlayer dielectrics 20, 30, 40, and 50. The interconnect layer 24 has a pattern with maximum dimensions according to the design rule in the shading target region 10A, as described above. The interconnect layer 34 has such a pattern that the interconnect layer 34 covers the region which is not covered with the interconnect layer 24 at least in the shading target region 10A. The interconnect layers 44 are provided at predetermined intervals. The interconnect layer 54 provided above the interconnect layer 44 is provided to be positioned at least between the adjacent interconnect layers 44.

The interconnect layers 44 and 54 are connected through the via layer 52 provided in the interlayer dielectric 50. The via layer 52 is provided in each overlapping section of the interconnect layers 44 and 54.

The shading region 10B provided outside the shading target region 10A is described below. FIGS. 6 to 8 illustrate only a part of the shading region 10B since only a part of the memory cell array is illustrated. However, the shading target region 10A is enclosed by the shading region 10B as described in the third embodiment (see FIG. 3B).

As shown in FIG. 8, in the shading region 10B, the interlayer dielectrics 20, 30, 40, 50, and 60 are provided on the semiconductor layer 10 in that order. The metal layers 28, 38, 48, and 58 having a predetermined pattern are respectively provided on the interlayer dielectrics 20, 30, 40, and 50. Each of the metal layers 28, 38, 48, and 58 is formed in the same step as the interconnect layer provided on the same interlayer dielectric in the shading target region 10A. In this embodiment, different symbols are assigned to a single metal layer between the area positioned in the shading target region 10A and the area positioned in the shading region 10B. For example, although the interconnect layer 54 and the metal layer 58 are continuous layers as shown in FIG. 8, these layers have been assigned different symbols depending on the position. The metal layer 28 and the semiconductor layer 10 are connected through the contact layer 26. The metal layers 28 and 38, the metal layers 38 and 48, and the metal layers 48 and 58 are respectively connected through the via layers 36, 46, and 56.

Figure 9:
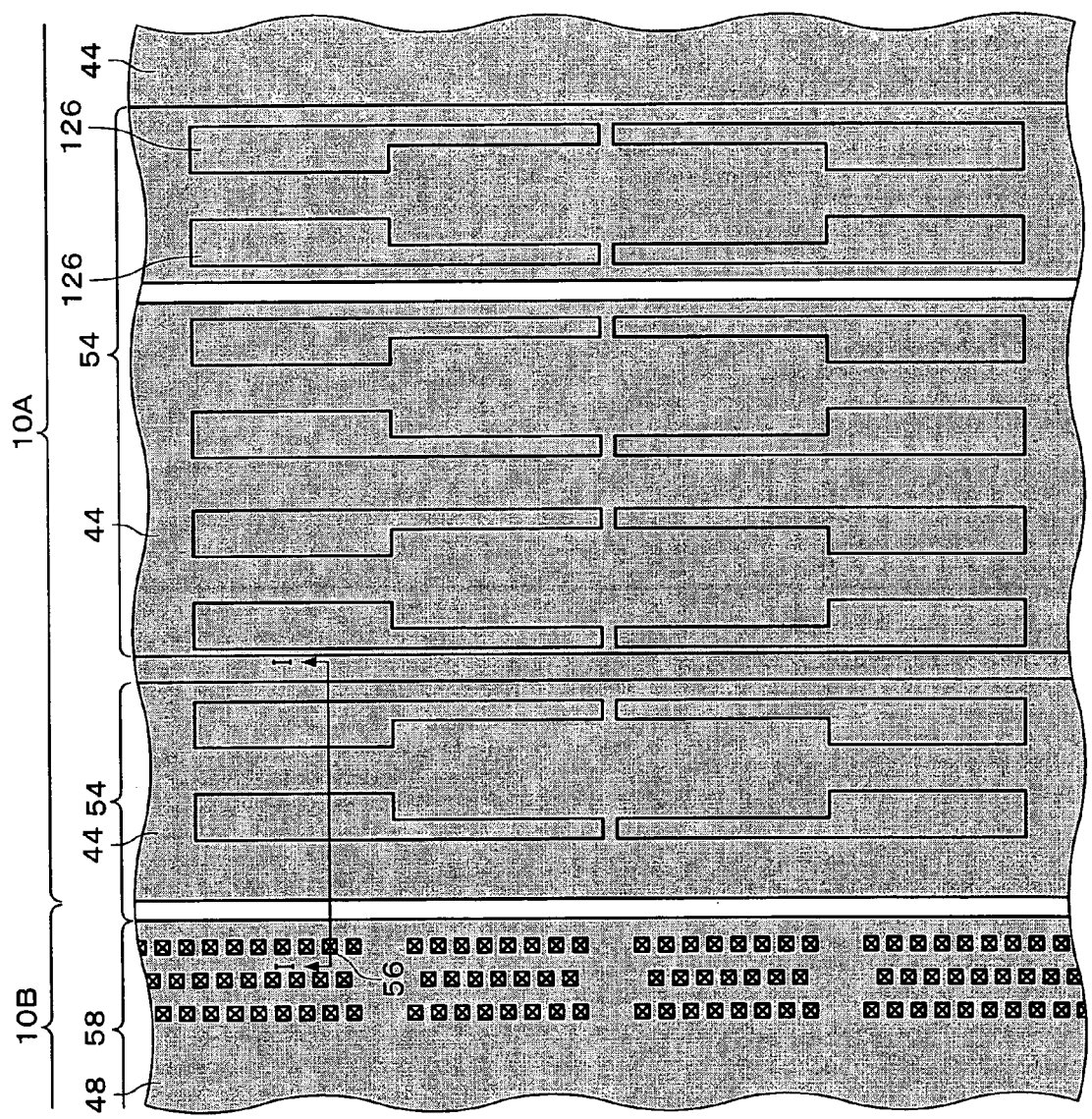
FIG. 9 is a plan view schematically showing the semiconductor device according to the fourth embodiment.

As shown in FIG. 9, the contact layer 26 and the via layers 36, 46, and 56 in the shading region 10B may be arranged in a plurality of rows and disposed in a staggered arrangement. These layers may be formed in the shape of a ring.

The advantages of the semiconductor device in this embodiment are described below.

In the semiconductor device in this embodiment, the entire memory cell array as the shading target region 10A is covered by controlling the patterns of the interconnect layer 24 and the interconnect layer 34. The single-layer gate type nonvolatile memory provided in the shading target region 10A in this embodiment has such a pattern that the difference between the area of the floating gate electrode in the control gate section (first region) and the area of the floating gate electrode in the write and erase regions (second and third regions) is increased in order to secure the capacity ratio. Therefore, the floating gate electrode 126 locally has a section in which the width or length is decreased or increased. In this case, even if the pattern of the interconnect layer is merely increased within the allowable range according to the design rule, the entire floating gate electrode 126 may not be covered. However, according to this embodiment, the entire floating gate electrode 126 having a non-uniform shape can be covered by controlling the patterns of the interconnect layers 24 and 34 at different levels. As a result, a semiconductor device of which the charge retention characteristics and reliability are improved can be provided.

The advantage obtained by providing the metal layers 44 and 54 at different levels above the interconnect layer 34 is described below. In the case of covering a region having a large area such as a memory cell array with a single metal layer, uniform etching may be difficult. Moreover, the lower interconnect layers 24 and 34 may not cover the entire memory cell array due to design rule limitations. However, the entire shading target region 10A can be covered by using the metal layers 44 and 45 as in this embodiment. As a result, the shading effect can be further improved, whereby a semiconductor device exhibiting improved reliability can be provided.

The advantage obtained by connecting the metal layers 44 and 54 through the via layer 52 is described below. In this case, incident of light in the lateral direction can be prevented, whereby a semiconductor device exhibiting an improved shading effect can be provided. Since the size of the entire shading layer provided above the shading target region must be increased in comparison with the size of the shading target region when it is desired to obtain the shading effect in the lateral direction merely by providing the shading layer above the shading target region, a sufficient reduction in size of the semiconductor device may not be achieved. However, the same degree of shading effect can be obtained by providing the via layer 52 between the shading layers 44 and 54, even if the area of the shading layer is decreased in comparison with the shading target region 10A. Specifically, a semiconductor device of which the reliability is improved while reducing the size can be provided.

The advantage obtained by providing the shading region 10B outside the shading target region 10A is described below. Since the via layer 26 and the contact layers 36, 46, and 56 are provided in the shading region 10B, incidence of light in the lateral direction can be further prevented. As a result, a semiconductor device with further improved reliability can be provided.

The invention is not limited to the above-described embodiments, and various modifications and variations may be made within the spirit and scope of the invention. For example, the first embodiment illustrates the case where the MOS transistor is provided in the shading region. However, the invention is not limited thereto. A stack gate type nonvolatile memory cell or a single-layer gate type nonvolatile memory may be provided in the shading region. In this case, a structure in which at least the floating gate electrode is covered with the shading layer is employed. The first embodiment illustrates the shading layers provided at different levels. However, the invention is not limited thereto. A structure consisting of three or more layers alternately arranged in a plan view may be realized. The above-described embodiment illustrates the case where the hole-shaped via layer and contact layer are provided in the shading region 10B. However, the invention is not limited thereto. For example, ring-shaped grooves may be provided to enclose the shading target region 10A, and the grooves may be filled with a conductive material to form a via layer and a contact layer.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A semiconductor device, comprising:
  a semiconductor layer having a shading target region;
  a semiconductor element provided on the semiconductor layer in the shading target region, the semiconductor element being a single-layer gate type nonvolatile memory and having a floating electrode constituting a single conductive layer;
a first interlayer dielectric provided on the semiconductor element;
a plurality of first shading layers provided on the first interlayer dielectric;
a second interlayer dielectric provided on at least the first shading layers; and
a second shading layer provided on the second interlayer dielectric,
wherein the first shading layer and the second shading layer are orthogonal when seen from top;
wherein the semiconductor layer is divided into a control gate section, a write section and an erase section by an element isolation insulating layer;
wherein the floating gate electrode is provided across the control gate section, the write section and the erase section;
wherein an insulating layer is provided between the floating gate electrode and the semiconductor layer;
wherein the control gate section comprises:
 a portion of the floating gate electrode;
 a portion of the insulating layer;
 a first conductivity-type first impurity region provided in the semiconductor layer below the floating gate electrode; and
 a first-conductivity type second impurity region provided adjacent to the first-conductivity-type first impurity region; and
wherein the write section comprises:
 a portion of the floating gate electrode;
 a portion of the insulating layer;
 a first conductivity type source region provided in the semiconductor layer; and
 a first conductivity type drain region provided in the semiconductor layer;
wherein the erase section comprises:
 a portion of the floating gate electrode;
 a portion of the insulating layer;
 a second conductivity type source region provided in the semiconductor layer; and
 a second conductivity type drain region provided in the semiconductor layer;
wherein the floating gate electrode in the control gate section is at least covered by the first shading layer; and
wherein the floating gate electrode in the write section and in the erase section are at least covered by the second shading layer.

2. The semiconductor device as defined in claim 1, wherein the shading target region is covered with at least one of the first shading layer and the second shading layer.

3. The semiconductor device as defined in claim 1, wherein at least one of the first shading layer and the second shading layer has the largest dimension allowed by the device in the shading target region.

4. The semiconductor device as defined in claim 1, wherein the second shading layer is provided to partially overlap the first shading layer.

5. The semiconductor device as defined in claim 1, wherein the first shading layer is an interconnect layer.

6. The semiconductor device as defined in claim 1, wherein the second shading layer is an interconnect layer.

7. The semiconductor device as defined in claim 1, further comprising:
a via layer which connects the first shading layer and the second shading layer.

8. The semiconductor device as defined in claim 7, wherein the via layer is provided in an overlapping area of the first shading layer and the second shading layer.

9. The semiconductor device as defined in claim 1, further comprising:
a third interlayer dielectric provided between the semiconductor element and the first interlayer dielectric; and
an interconnect layer provided on the third interlayer dielectric,
wherein the interconnect layer the largest dimension allowed by the device in the shading target region.

10. A semiconductor device, comprising:
a semiconductor layer having a shading target region;
a semiconductor element provided on the semiconductor layer in the shading target region;
a first interlayer dielectric provided on the semiconductor element;
a first shading layer provided on the first interlayer dielectric,
wherein the first shading layer has the largest dimension allowed by the device in the shading target region.

11. The semiconductor device as defined in claim 1, comprising:
a shading region provided outside the shading target region,
wherein the shading region includes:
the first interlayer dielectric provided on the semiconductor layer;
a first metal layer provided on the first interlayer dielectric;
at least one contact layer provided between the semiconductor layer and the first metal layer;
the second interlayer dielectric provided on at least the first metal layer;
a second metal layer provided on the second interlayer dielectric; and
at least one via layer which connects the first metal layer and the second metal layer.

12. The semiconductor device as defined in claim 11, wherein the shading region is provided to enclose the shading target region.

13. The semiconductor device as defined in claim 11, wherein the via layer is formed by filling a ring-shaped groove with a conductive layer in the shading region.

14. The semiconductor device as defined in claim 11, wherein the contact layer is formed by filling a ring-shaped groove with a conductive layer in the shading region.

15. The semiconductor device as defined in claim 11, wherein the via layers are provided in the shading region in a staggered arrangement.

16. The semiconductor device as defined in claim 11, wherein the contact layers are provided in the shading region in a staggered arrangement.

17. The semiconductor device as defined in claim 10, comprising:
a shading region provided outside the shading target region,
wherein the shading region includes:
the first interlayer dielectric provided on the semiconductor layer;
a first metal layer provided on the first interlayer dielectric;

at least one contact layer provided between the semiconductor layer and the first metal layer;

the second interlayer dielectric provided on at least the first metal layer;

a second metal layer provided on the second interlayer dielectric; and at least one via layer which connects the first metal layer and the second metal layer.

18. The semiconductor device as defined in claim 17, wherein the shading region is provided to enclose the shading target region.

19. The semiconductor device as defined in claim 17, wherein the via layer is formed by filling a ring-shaped groove with a conductive layer in the shading region.

20. The semiconductor device as defined in claim 17, wherein the contact layer is formed by filling a ring-shaped groove with a conductive layer in the shading region.

21. The semiconductor device as defined in claim 17, wherein the via layers are provided in the shading region in a staggered arrangement.

22. The semiconductor device as defined in claim 17, wherein the contact layers are provided in the shading region in a staggered arrangement.

23. The semiconductor device as defined in claim 10, wherein the semiconductor element is a single-layer gate type nonvolatile memory.

24. The semiconductor device as defined in claim 1, wherein the first conductivity type is N-type and the second conductivity type is P-type.

25. The semiconductor device as defined in claim 1, wherein the floating gate electrode in the control gate section has a larger area than the floating gate electrode in the write section and in the erase section.

26. The semiconductor device as defined in claim 1, wherein the first and second shading layers are orthogonal interconnect layers.

27. The semiconductor device as defined in claim 1, wherein the first shading layer is a first layer of interconnect layers and the second shading layer is a second layer of interconnect layers.

* * * * *